United States Patent [19]

Zajac

[11] 4,255,230
[45] Mar. 10, 1981

[54] PLASMA ETCHING PROCESS

[75] Inventor: John Zajac, Santa Clara, Calif.

[73] Assignee: Eaton Corporation, Cleveland, Ohio

[21] Appl. No.: 123,829

[22] Filed: Feb. 22, 1980

[51] Int. Cl.³ .......................................... H01L 21/306
[52] U.S. Cl. .................................. 156/643; 156/646;
156/662; 204/192 E; 252/79.1
[58] Field of Search ............ 156/643, 646, 657, 659.1,
156/662, 345; 204/164, 192 E, 298; 250/531;
252/79.1

[56] References Cited

U.S. PATENT DOCUMENTS

| | | | |
|---|---|---|---|
| 4,069,096 | 1/1978 | Reinberg et al. | 156/643 |
| 4,094,722 | 6/1978 | Yamamoto et al. | 156/345 |
| 4,174,251 | 11/1979 | Paschke | 156/643 |

*Primary Examiner*—William A. Powell
*Attorney, Agent, or Firm*—Limbach, Limbach & Sutton

[57] ABSTRACT

In an improved process for the etching of polysilicon substrates, a polysilicon substrate is exposed to plasmas of carbon tetrachloride, chlorinated gas, fluorinated gas or a gas capable of generating both chlorinated and fluorinated plasma species. The combination of a chlorinated and fluorinated etching species substantially reduces undercutting of polysilicon substrates. Improved uniformity of polysilicon etching is also achieved.

13 Claims, 2 Drawing Figures

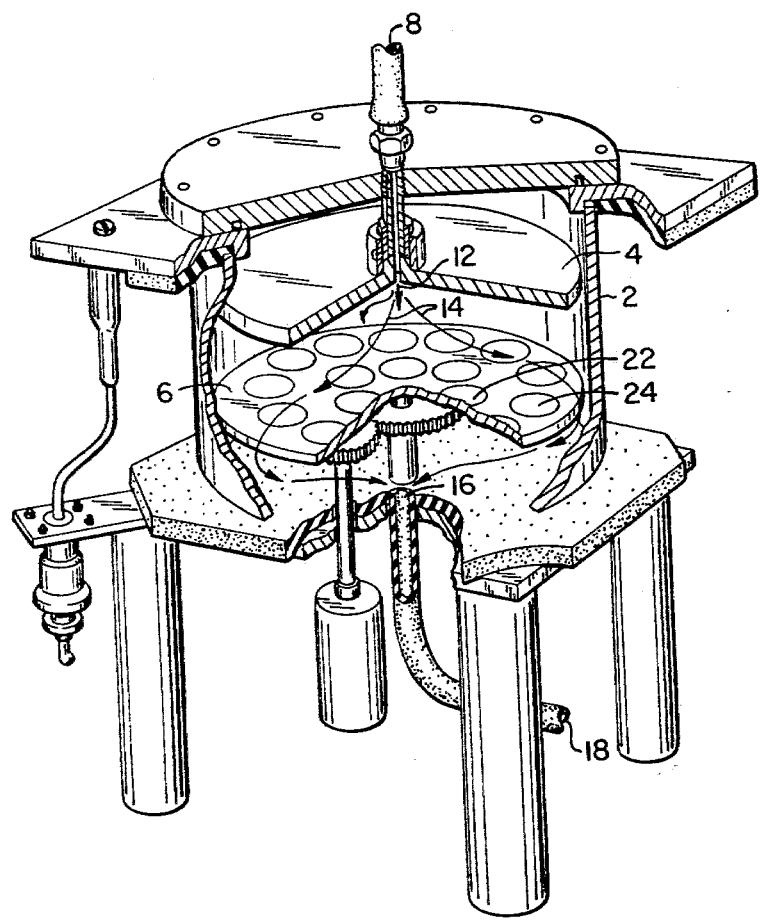
FIG._1.
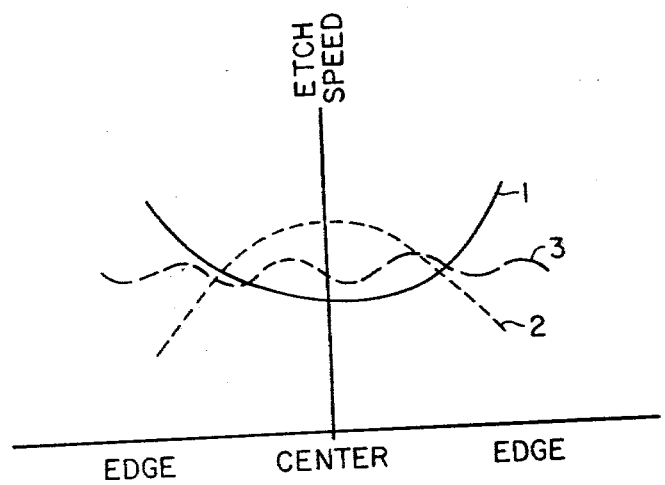
FIG._2.

PLASMA ETCHING PROCESS

BACKGROUND OF THE INVENTION

1. Field of the Invention

This invention relates to an improved process for the plasma etching of polysilicon substrates involving the use of distinct plasma species. A plasma can be generated when a gas, for example, chlorine, is exposed to a current of electricity under certain conditions. Although the chemical nature of plasmas are not clearly understood, it is known that a highly excited species can be made by exposing certain gases to high energy radio frequencies. Under the influence of these radio frequencies, the gases breakdown and rearrange to form transitory species with life spans so short that they are difficult to identify. Accordingly, unexpected reactions can be effected in a plasma that are difficult or impossible to effect using more conventional techniques. For example, a plasma of a very inert gas such as a fluorocarbon, known commercially as Freon, will etch glass, indicating that an active fluorine species is present in the plasma. In addition to the active chemical species, there are strong radiations, such as ultraviolet, and strong ion and electron bombardment of the surfaces within the plasma.

Considering the enigmatic properties of plasmas, certain unique problems occur in the use of specific etching species. Previous etch gases used to generate etching plasmas, such as sulfur hexafluoride, carbon tetrachloride and others, have been used by themselves, or in combination with other etching gases or with inert carrier gases such as helium, oxygen, etc. Each of these previous gases have some advantage over their counterparts, but suffer, usually, from other drawbacks. Whereas one may give very good uniformity of etching, there may be excessive undercutting (isentropicity). Another gas may have demonstrated improved selectivity in etching between the polysilicon and underlying silicon dioxide but with a decrease in etch rate.

2. Brief Statement of the Prior Art

Yamamoto, et al., U.S. Pat. No. 4,094,722 teaches a plasma etching apparatus using tetrafluoromethane ($CF_4$) and oxygen as a carrier to etch polysilicon wafers. Apparently, the inventors did not think that any other etch gas would be feasible for the etching of polysilicon. For example, ordinarily polysilicon would not be etched by chlorine in a plasma mode. On the other hand, polysilicon can be etched by chlorine in a sputtering mode. Other inventions have shown that aluminum is easily etched by highly reactive species. That was the subject matter of applicant's co-pending application Ser. No. 928,597 filed July 27, 1978, U.S. Pat. No. 4,182,646. However, the combination of a fluorinated and a chlorinated gas has not been heretofore seen in the art.

Currently, problems in plasma etching of polysilicon reside in three areas. One area is selectivity in the amount of polysilicon layer etched in comparison with underlying silicon dioxide—naturally, the higher selectivity for polysilicon, the better. As mentioned, tetrafluoromethane has been used in conjunction with oxygen to provide an etching plasma. Selectivity of etching using tetrafluoromethane is about 5–10 to 1. Unfortunately, use of this etchant gas has been observed to etch preferentially about the outside edge of the substrate, the so-called "bulls-eye effect". Sulfur hexafluoride on the other hand, has a even greater selectivity of 10–20 to 1.

A grave problem in the use of both sulfur hexafluoride and tetrafluoromethane etchants is the phenomenom of undercutting. Undercutting occurs when the etchant gas removes polysilicon underneath the photoresist.

The last problem in polysilicon etching is in the uniformity of etching. It has been found, through experimentation, that a fluorinated gas, eg., sulfur hexafluoride, especially in combination with carbon monoxide, gives extremely good selectivity, but very poor uniformity.

SUMMARY AND OBJECTS OF THE INVENTION

The various enumerated problems above have limited the use of plasma in etching of polysilicon. Plasma etching by single gas, or even by gases in succession may not address all of these limitations.

It is thus an object of this invention to obtain plasma etching of polysilicon whose selectivity of etching is 10-1 or higher.

It is a further object of this invention to prevent undercutting of a polysilicon substrate by introduction of a chlorinated gas to a fluorinated gas.

It is a still further object of this invention to improve uniformity in the plasma etching of polysilicon by a mixture of carbon tetrachloride and a chlorinated gas.

BRIEF DESCRIPTION OF THE DRAWINGS

FIG. 1 is a perspective view of a representative plasma etching device.

FIG. 2 is a graphical depiction comparing uniformity of etch across the polysilicon substrate by various plasma species.

DESCRIPTION OF THE PREFERRED EMBODIMENTS

Referring now to FIG. 1, a representatives plasma etching apparatus is shown which is typical of a commercial device capable of practicing the present invention. A gas which will form a plasma introduced via intake port 8, passes to the interior of the chamber 2 via orifice 12 of top plate 4 and flows between plates 4 and 6 and over representative polysilicon wafers 22 and 24. The gas will form a plasma when subjected to an electric field placed between plates 4 and 6. The plasma is thereafter removed from the chamber by means of orifice 16 and vacuum line 18.

In one preferred embodiment, carbon tetrachloride is first introduced as the etchant gas into the interior of chamber 2. Simultaneously with or subsequently to the addition of the $CCl_4$, a chlorinated gas, such chlorine is introduced. This is denoted "cycle one". Thereafter, the combination of a fluorinated gas such as $SF_6$ and chlorinated gas such as chlorine ($Cl_2$) are added. This is labelled "cycle two".

For the purposes of this invention, one example of the chlorinated gas may be chlorine. However, experimentation has shown that adding nitrogen to the chlorine may be useful for improving uniformity of etching of each polysilicon substrate. It is hypothesized that nitrogen improves uniformity of etching in carrying more gas to the chamber. It is possible that helium or another inert gas could replace nitrogen. Yet, omission of nitrogen may not affect the efficiency of the chlorinated species. The amount of chlorine in this chlorinated species should be at least 50%. In "cycle two", the fluorinated gas may also comprise a "carrier" such as carbon monoxide, where the former is at least 50% of the total. Ideally, the fluorinated gas is at least 25% of the total volume of "cycle one" and "cycle two" gases added.

The ratio of cycle one to cycle two gases may range from approximately 3:1 to 1:1.

As previously described above, other fluorinated gases such as tetrafluoromethane are effective in etching polysilicon wafers in a plasma etching mode. Fluorinated gases selectively etch polysilicon substrates at ratios of 5 to 1 or better. Sulfur hexafluoride, it has been noted, has an etching selectivity of 10–20 to 1. Hence, due to its superior selectivity, sulfur hexafluoride is preferred.

It has been discovered that the dual problems of undercutting and poor uniformity results from the use of a fluorinated gas itself in the etching of polysilicon. By the introduction of the chlorinated gas, which may be, for example, carbon tetrachloride, chlorine, etc., undercutting of a polysilicon substrate by the fluorinated species is controlled extremely well.

The problem of uniformity of etching of a polysilicon substrate by fluorinated gas is again not very good. For example, referring to FIG. 2 a graph in which the abscissa is the etch speed of a representative plasma etching device, and the ordinate is the geographic uniformity of etching of a 3 inch wafer in a plasma etch mode, optimum etch speed is around 1000 angstroms per minute. At this speed using a fluorine species it is observed that the edges etch faster than the center, graphically shown as curve 1. On the other hand, referring to curve 2, where the etching species comprises a mixture of chlorinated gases, eg., carbon tetrachloride and chlorine, at the same 1000 angstroms per minute etch rate, the center etches faster than the edges. It was found that introducing a mixture of a chlorine and carbon tetrachloride species to a fluorine species, the opposed preferential etch rates complement each other. Graphically this is shown by curve 3 which is the graphical complement of curves 1 and 2.

Experimental data was collected in one example of a specific embodiment of the invention:

EXAMPLE 1

The process as practiced in one specific mode of the invention produced extremely good results in each of the three problem areas outlined above. Again referring to FIG. 1, carbon tetrachloride was introduced into the interior of chamber 2 at a partial pressure was approximately 100 microns. Next, a chlorinated gas was introduced, comprising approximately 72% chlorine by volume and approximately 28% nitrogen by volume, and having a partial pressure of approximately 30 microns. During "cycle one", a current in the range of 2.5–3.5 amperes was applied to parallel plates 4 and 6 for approximately 2.5 minutes.

In "cycle two", a mixture of sulfur hexafluoride and carbon monoxide was introduced together with the mixture of chlorine and nitrogen. Sulfur hexafluoride constituted approximately 78% and carbon monoxide approximately 22% of the total volume of the mixture while the chlorine/nitrogen mixture was 72% $Cl_2$ and 28% $N_2$. The partial pressure of the $SF_6/CO$ mixture ranged from 15–30 microns with the partial pressure of the $Cl_2/N_2$ being 30 microns. In "cycle two", the amount of current used was scaled down to approximately 0.75 amps for 2.5 minutes. As in this example, the total pressure of the system ranged from approximately 75–150 microns. Optimum results were obtained in the range of 100–125 microns.

Although the present invention was described, for the sake of simplicity, as comprising the use of separate chlorinated and fluorinated species, the use of a single chemical species which is capable of generating both chlorinated and fluorinated plasmas is intended to be embraced within the present disclosure. It is only necessary that chlorinated and fluorinated plasma species be formed in the etching of the polysilicon wafers. The sources of these etchants are certainly within the knowledge of one of ordinary skill in the art and the present invention is not to be limited by the particular sources of the plasmas.

What is claimed is:

1. A process for plasma etching polysilicon substrates comprising contacting a polysilicon substrate with:
   (a) a plasma of carbon tetrachloride and a plasma of a chlorinated gas, and
   (b) a plasma of a fluorinated gas and a plasma of a chlorinated gas.

2. The process of claim 1 wherein said chlorinated gas is chlorine.

3. The process of claim 1 wherein said fluorinated gas is sulfur hexafluoride.

4. A process for the plasma etching of polysilicon substrates comprising:
   (a) contacting a polysilicon substrate with a first plasma of carbon tetrachloride and a chlorinated gas,
   (b) removing said carbon tetrachloride and chlorinated gas, and
   (d) contacting a said polysilicon substrate with a plasma of a fluorinated gas and chlorinated gas.

5. The process of claim 4 wherein said chlorinated gas is chlorine and said fluorinated gas is sulfur hexafluoride.

6. The process of claim 4 wherein said chlorinated gas comprises carbon tetrachloride.

7. The process of claim 4 wherein said fluorinated gas comprises tetra fluoromethane.

8. The process of claim 4 wherein said chlorinated gas further comprises an inert gas.

9. The process of claim 4 wherein said fluorinated gas further comprises an inert gas.

10. The process of claim 8 wherein said chlorinated gas is present in at least 50% by volume of the mixture of chlorinated gas and inert gas.

11. The process of claim 9 wherein said fluorinated gas is present in at least 50% by volume of the mixture of fluorinated gas and inert gas.

12. The process of claim 10 wherein said chlorinated gas is present in an amount approximately 72% by volume of the mixture of chlorinated gas and inert gas.

13. The process of claim 11 wherein said fluorinated gas is present in an amount approximately 78% by volume of the mixture of fluorinated gas and inert gas.

* * * * *